(12) United States Patent
Kakuda et al.

(10) Patent No.: US 11,168,396 B2
(45) Date of Patent: Nov. 9, 2021

(54) METHOD OF MANUFACTURING SEMICONDUCTOR DEVICE AND RECORDING MEDIUM

(71) Applicant: KOKUSAI ELECTRIC CORPORATION, Tokyo (JP)

(72) Inventors: Toru Kakuda, Toyama (JP); Masahisa Okuno, Toyama (JP); Katsuhiko Yamamoto, Toyama (JP); Takuya Joda, Toyama (JP); Sadayoshi Horii, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 13 days.

(21) Appl. No.: 16/570,074

(22) Filed: Sep. 13, 2019

(65) Prior Publication Data

US 2020/0002816 A1 Jan. 2, 2020

Related U.S. Application Data

(63) Continuation of application No. PCT/JP2017/011637, filed on Mar. 23, 2017.

(51) Int. Cl.
*H01L 21/00* (2006.01)
*C23C 16/46* (2006.01)
*H01L 21/02* (2006.01)
*H01L 21/67* (2006.01)

(52) U.S. Cl.
CPC ........ *C23C 16/46* (2013.01); *H01L 21/02222* (2013.01); *H01L 21/67248* (2013.01)

(58) Field of Classification Search
CPC ............... C23C 16/46; H01L 21/02222; H01L 21/67248
See application file for complete search history.

(56) References Cited

U.S. PATENT DOCUMENTS

| 2013/0124283 A1 | 5/2013 | Kaulbach |
| 2013/0316515 A1 | 11/2013 | Nagahara et al. |
| 2014/0302687 A1 | 10/2014 | Ashihara et al. |

(Continued)

FOREIGN PATENT DOCUMENTS

| JP | 2008-010884 A | 1/2008 |
| JP | 2012-174717 A | 9/2012 |

(Continued)

OTHER PUBLICATIONS

Singaporean Written Opinion dated Feb. 27, 2020 for the Singaporean Patent Application No. 11201908474W.

(Continued)

*Primary Examiner* — Richard A Booth
(74) *Attorney, Agent, or Firm* — Volpe Koenig

(57) ABSTRACT

There is provided a technique that includes a first act of modifying a film containing a silazane bond by heating a substrate, in which the film containing the silazane bond is formed over a surface of the substrate, to a first temperature and by supplying a first processing gas containing hydrogen peroxide to the substrate; and after the first act, a second act of modifying the film containing the silazane bond by heating the substrate to a second temperature higher than the first temperature and by supplying a second processing gas containing hydrogen peroxide to the substrate.

13 Claims, 7 Drawing Sheets

(56) References Cited

U.S. PATENT DOCUMENTS

2015/0262817 A1 9/2015 Okuno et al.
2015/0282125 A1 10/2015 Lee et al.
2017/0365459 A1* 12/2017 Ohashi ................. C23C 16/401

FOREIGN PATENT DOCUMENTS

| WO | 2013/070343 A1 | 5/2013 |
| WO | 2013/094680 A1 | 6/2013 |
| WO | 2014/069826 A1 | 5/2014 |
| WO | 2015/016180 A1 | 2/2015 |

OTHER PUBLICATIONS

International Search Report, PCT/JP2017/011637, dated Jun. 20, 2017, 2 pgs.

* cited by examiner

METHOD OF MANUFACTURING SEMICONDUCTOR DEVICE AND RECORDING MEDIUM

CROSS-REFERENCE TO RELATED APPLICATIONS

This application is a Bypass Continuation Application of PCT International Application No. PCT/JP2017/011637, filed on Mar. 23, 2017, the entire contents of which are incorporated herein by reference.

TECHNICAL FIELD

The present disclosure relates to a method of manufacturing a semiconductor device and a recording medium.

BACKGROUND

As an example of a process of manufacturing a semiconductor device, a substrate processing of processing a film formed over a surface of a substrate is often carried out by supplying a processing gas containing hydrogen peroxide to the substrate.

SUMMARY

The present disclosure provides some embodiments of a technique capable of improving a quality of substrate processing performed using hydrogen peroxide.

According to one or more embodiments of the present disclosure, there is provided a technique that includes a first act of modifying a film containing a silazane bond by heating a substrate, in which the film containing the silazane bond is formed over a surface of the substrate, to a first temperature and by supplying a first processing gas containing hydrogen peroxide to the substrate; and after the first act, a second act of modifying the film containing the silazane bond by heating the substrate to a second temperature higher than the first temperature and by supplying a second processing gas containing hydrogen peroxide to the substrate.

DETAILED DESCRIPTION

One or More Embodiments of the Present Disclosure

The embodiments of the present disclosure will now be described with reference to FIGS. 1, 2, 3A, 4, and 5.

(1) Configuration of the Substrate Processing Apparatus

Figure 1:
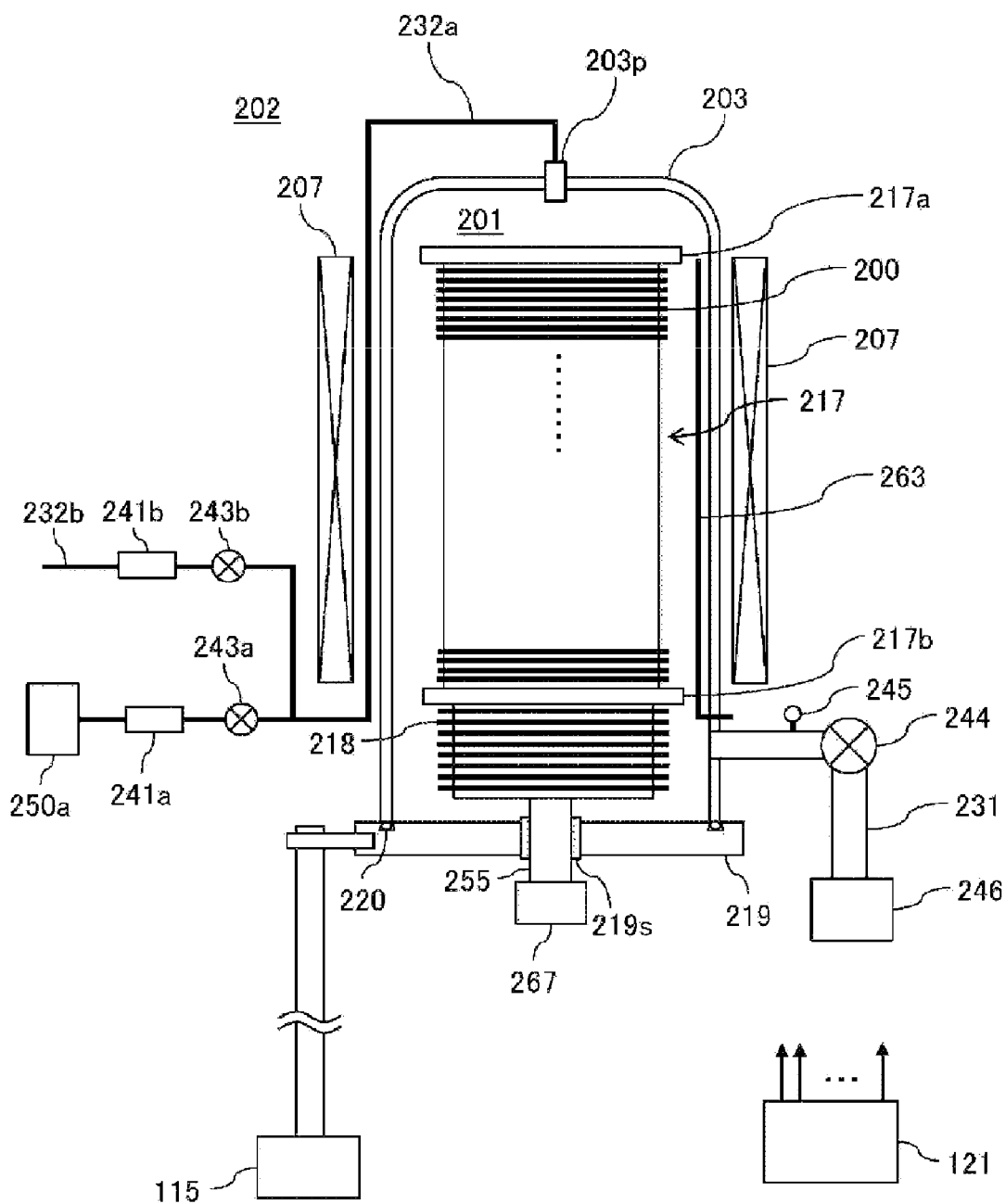
FIG. 1 is a schematic configuration diagram of a vertical type process furnace of a substrate processing apparatus suitably used in embodiments of the present disclosure, in which a portion of the process furnace is shown in a vertical cross sectional view.

As illustrated in FIG. 1, a process furnace 202 includes a reaction tube 203. The reaction tube 203 is made of a heat resistant material, e.g., quartz ($SiO_2$), silicon carbide (SiC) or the like, and has a cylindrical shape with a gas supply port 203p at its upper end and a furnace opening (opening) at its lower end. A process chamber 201 is formed in a hollow cylindrical portion of the reaction tube 203. The process chamber 201 is configured to accommodate a plurality of wafers 200 as substrates.

A seal cap 219, which serves as a lid configured to hermetically seal a lower end opening of the reaction tube 203, is installed under the reaction tube 203. The seal cap 219 is made of a non-metallic material such as, e.g., quartz or the like, and is formed in a disc shape. An O-ring 220, which is a seal member making contact with the lower end portion of the reaction tube 203, is installed on an upper surface of the seal cap 219. A rotation mechanism 267 is installed under the seal cap 219. A rotary shaft 255 of the rotation mechanism 267, which penetrates the seal cap 219, is connected to a boat 217. The rotation mechanism 267 is configured to rotate the wafers 200 by rotating the boat 217. A bearing 219s of the rotary shaft 255 installed on the rotary shaft 255 is configured as a fluid seal such as a magnetic seal or the like. The seal cap 219 is configured to be vertically moved up and down by a boat elevator 115 which is an elevator mechanism installed outside the reaction tube 203. The boat elevator 115 is configured as a transfer mechanism which loads and unloads (transfers) the wafers 200 into and from (out of) the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC, and includes a top plate 217a and a bottom plate 217b at its top and bottom. Heat insulators 218 supported in a horizontal posture and in multiple stages below the boat 217 are made of a heat resistant material such as, e.g., quartz or SiC, and are configured to suppress heat conduction between a wafer accommodation region and a near-furnace opening region. The bottom plate 217b may be installed below the heat insulators 218. The heat insulators 218 may be regarded as part of the components of the boat 217.

A heater 207 as a heating part is installed outside the reaction tube 203. The heater 207 is vertically installed so as to surround the wafer accommodation region in the process chamber 201. The heater 207 serves to heat the wafers 200 accommodated in the wafer accommodation region to a predetermined temperature, and also functions as a liquefaction suppressing mechanism that suppresses liquefaction of a gas supplied into the process chamber 201 by applying thermal energy to the gas or functions as an excitation mechanism configured to thermally activate the gas. A temperature sensor 263 serving as a temperature detection part is installed in the process chamber 201 along the inner wall of the reaction tube 203. The output of the heater 207 is adjusted based on temperature information detected by the temperature sensor 263.

A gas supply pipe 232a is connected to the gas supply port 203p installed at the upper end of the reaction tube 203. A gas generator 250a, a mass flow controller (WC) 241a, which is a flow rate controller (flow rate control part), and a valve 243a, which is an opening/closing valve, are installed in the gas supply pipe 232a sequentially from the corresponding upstream side.

The gas generator 250a is configured to generate a processing gas by vaporizing or misting a hydrogen peroxide solution as a liquid precursor, such as heating it to a predetermined temperature (vaporization temperature) which falls within a range of, e.g., 120 to 200 degrees C. under substantially an atmospheric pressure. The hydrogen peroxide solution used herein is an aqueous solution obtained by dissolving hydrogen peroxide ($H_2O_2$), which is a liquid under an atmospheric temperature, in water ($H_2O$) as a solvent. $H_2O_2$ and $H_2O$ are respectively contained in predetermined concentrations in the gas obtained by vaporizing the hydrogen peroxide solution. Hereinafter, this gas will be referred to as an $H_2O_2$-containing gas. Furthermore, a processing gas used at a first modification step as described hereinbelow will be referred to as a first processing gas, and a processing gas used at a second modification step as described hereinbelow will be referred to as a second processing gas. $H_2O_2$ contained in the processing gas is a kind of active oxygen, which is unstable, easily releases oxygen (O), and generates hydroxy radical (OH radical) having very strong oxidizing power. Therefore, the $H_2O_2$-containing gas acts as a strong oxidizing agent (O source) in the substrate processing as described hereinbelow.

A gas supply pipe 232b for supplying a carrier gas (dilution gas) is connected to the gas supply pipe 232a at the downstream side of the valve 243a and at the upstream side of a portion heated by the heater 207. An MFC 241b and a valve 243b are installed in the gas supply pipe 232b sequentially from the corresponding upstream side. As the carrier gas, it may be possible to use a hydrogen peroxide-free O-containing gas such as an oxygen ($O_2$) gas or the like, an inert gas such as nitrogen ($N_2$) gas, a rare gas or the like, or a mixture thereof.

Furthermore, in the present embodiments, when vaporizing or misting the hydrogen peroxide solution, the hydrogen peroxide solution is misted (atomized) by supplying a carrier gas for vaporization together with the hydrogen peroxide solution to the gas generator 250a. The flow rate of the carrier gas for vaporization is, e.g., about 100 to 500 times the flow rate of the hydrogen peroxide solution. As the carrier gas for vaporization, it may be possible to use a gas similar to the aforementioned carrier gas (dilution gas). In the case of using the carrier gas for vaporization or the carrier gas (dilution gas), the carrier gas for vaporization or the carrier gas (dilution gas) may be regarded as being included in each of the "processing gas," "the $H_2O_2$-containing gas," "the first processing gas," and "the second processing gas" described above.

A processing gas supply system mainly includes the gas supply pipe 232a, the MFC 241a, and the valve 243a. Furthermore, a carrier gas (dilution gas) supply system mainly includes the gas supply pipe 232b, the MFC 241b, and the valve 243b.

An exhaust pipe 231 configured to exhaust an internal atmosphere of the process chamber 201 is installed at a lower side of the sidewall of the reaction tube 203. A vacuum pump 246 as a vacuum exhaust device is connected to the exhaust pipe 231 via a pressure sensor 245 as a pressure detector which detects the internal pressure of the process chamber 201 and an APC valve 244 as a pressure regulator. The APC valve 244 is configured so that a vacuum exhaust of the interior of the process chamber 201 and a vacuum exhaust stop can be performed by opening and closing the APC valve 244 while operating the vacuum pump 246 and so that the internal pressure of the process chamber 201 can be adjusted by adjusting an opening degree of the APC valve 244 based on pressure information detected by the pressure sensor 245 while operating the vacuum pump 246. An exhaust system mainly includes the exhaust pipe 231, the APC valve 244, and the pressure sensor 245. The vacuum pump 246 may be regarded as being included in the exhaust system.

Figure 2:
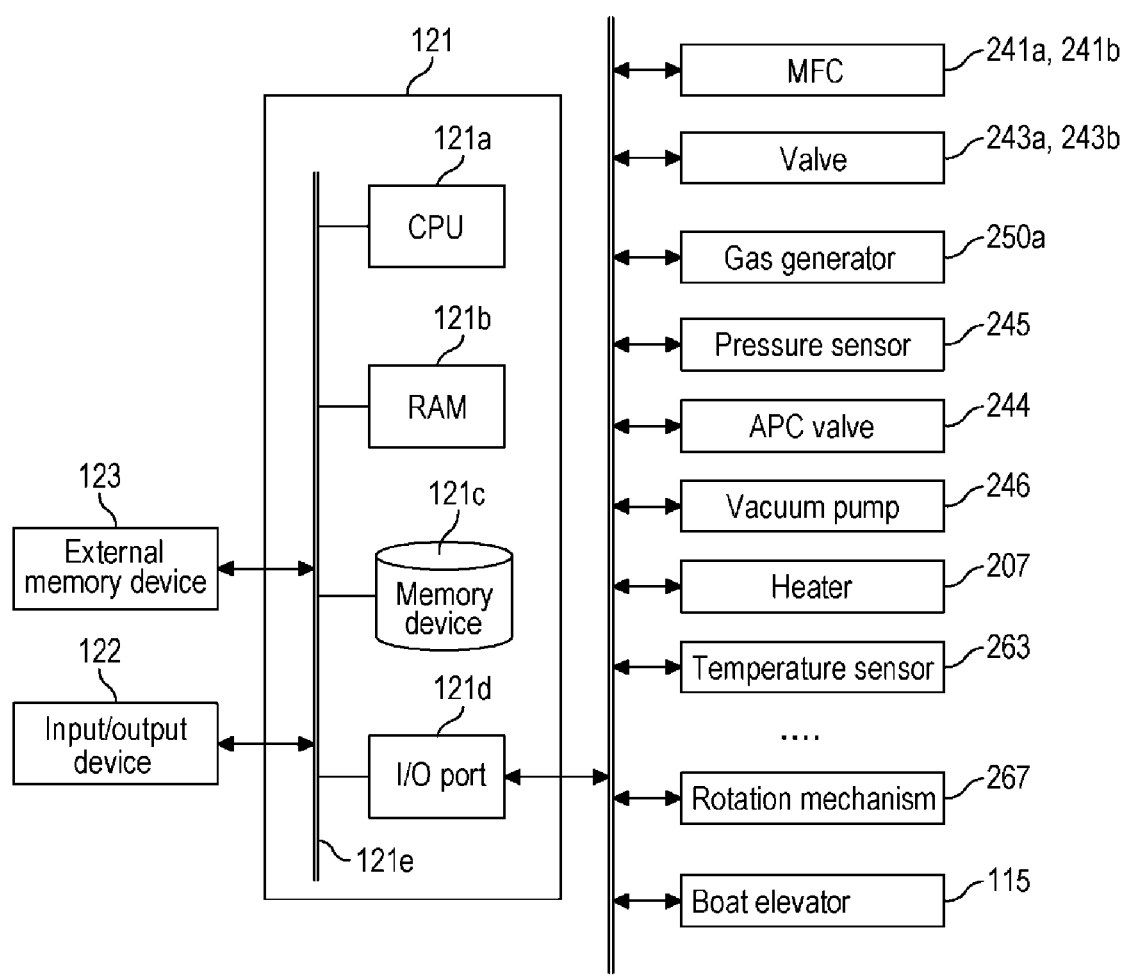
FIG. 2 is a schematic configuration diagram of a controller of the substrate processing apparatus suitably used in one or more embodiments of the present disclosure, in which a control system of the controller is shown in a block diagram.

As illustrated in FIG. 2, a controller 121, which is a control part, may be configured as a computer including a CPU 121a, an RAM 121b, a memory device 121c, and an I/O port 121d. The RAM 121b, the memory device 121c, and the I/O port 121d are configured to exchange data with the CPU 121a via an internal bus 121e. An input/output device 122 formed of a touch panel or the like is connected to the controller 121.

The memory device 121c is configured by, for example, a flash memory, an HDD, or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data or the like read by the CPU 121a is temporarily stored.

The I/O port 121d is connected to the MFCs 241a and 241b, the valves 243a and 243b, the gas generator 250a, the pressure sensor 245, the APC valve 244, the vacuum pump 246, the heater 207, the temperature sensor 263, the rotation mechanism 267, the boat elevator 115, and the like, as described above.

The CPU 121a is configured to read the control program from the memory device 121c and execute the same. The CPU 121a is also configured to read the recipe from the memory device 121c according to an input of an operation command from the input/output device 122. In addition, the CPU 121a is configured to control, according to the contents of the recipe thus read, the gas-generating operation by the gas generator 250a, the flow rate-adjusting operation of various kinds of gases by the MFCs 241a and 241b, the opening/closing operation of the valves 243a and 243b, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like.

The controller 121 may be configured by installing, on the computer, the aforementioned program stored in an external memory device 123 (for example, a magnetic disc such as an HDD, an optical disc such as a CD, a magneto-optical disc such as an MO, or a semiconductor memory such as a USB memory). The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Pre-Processing Step

Next, a pre-processing step performed prior to performing the substrate processing on a wafer 200 will be described with reference to FIG. 3A.

Figure 3A:
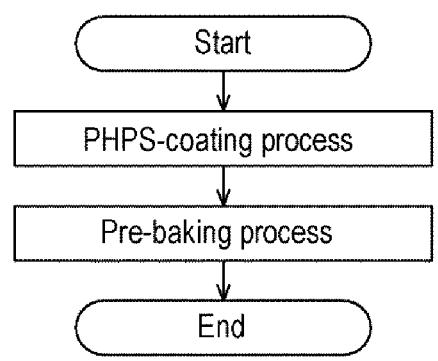
FIGS. 3A and 3B are flowcharts illustrating examples of a pre-processing step.

As illustrated in FIG. 3A, at this step, a polysilazane (PHPS)-coating process and a pre-baking process are sequentially performed on the wafer 200. At the PHPS-coating process, a coating solution containing polysilazane (polysilazane solution) is coated on a surface of the wafer 200 using a method such as a spin-coating method or the like. In the pre-baking process, a solvent is removed from a coating film by heating the wafer 200 on which the coating film is formed. The solvent may be volatilized from the coating film by heating the wafer 200, on which the coating formed is formed, at a processing temperature (pre-baking temperature) which falls within a range of, e.g., 70 to 250 degrees C. This heat treatment may be performed at about 150 degrees C. in some embodiments.

The coating film formed over the surface of the wafer 200 becomes a film (polysilazane film) having a silazane bond (—Si—N—) via the pre-baking process. This film contains nitrogen (N) and hydrogen (H) in addition to silicon (Si), and may further contain a mixture of carbon (C) and another impurity. In the substrate processing as described hereinbelow, this film is modified (oxidized) by supplying a processing gas containing $H_2O_2$ to the polysilazane film formed over the wafer 200 under a predetermined temperature condition.

(3) Substrate Processing

Next, an example of substrate processing performed using the aforementioned substrate processing apparatus, which is a process for manufacturing a semiconductor device, will be described with reference to FIGS. 4 and 5. In the following descriptions, operations of the respective parts constituting the substrate processing apparatus are controlled by the controller 121.

Figure 4:
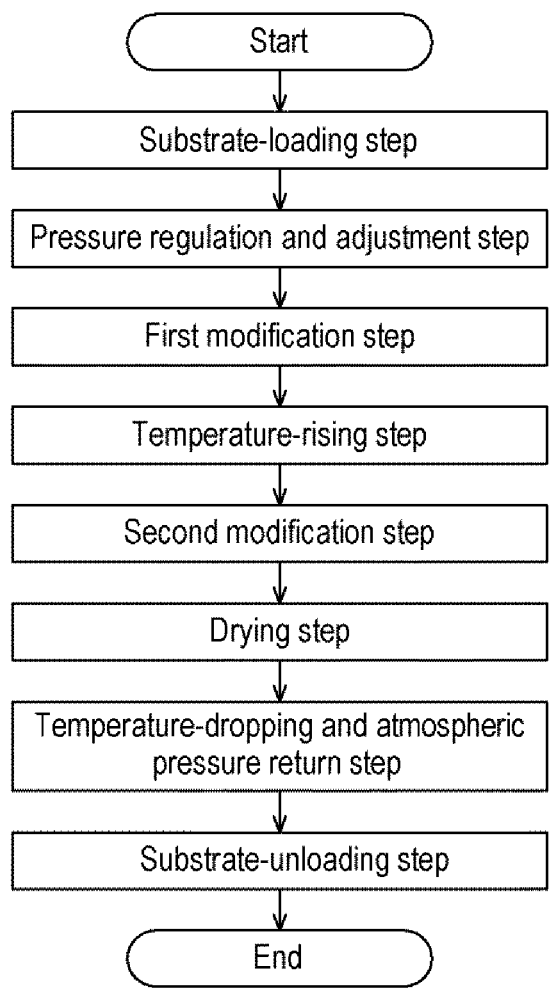
FIG. 4 is a flowchart illustrating an example of substrate processing performed after the pre-processing step.
Figure 5:
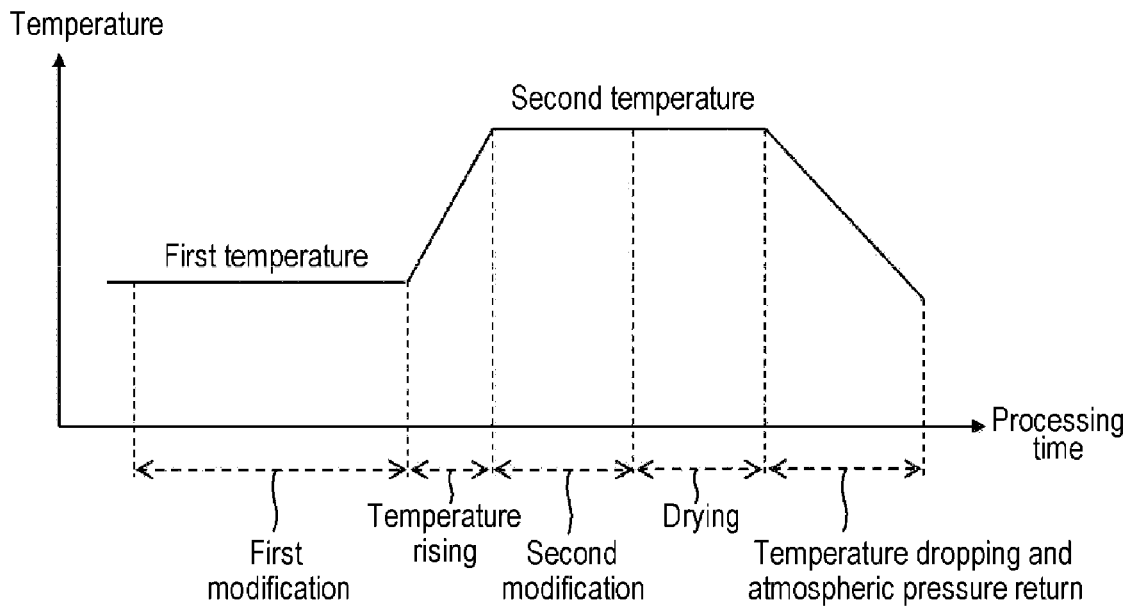
FIG. 5 is a flowchart illustrating an example of temperature control in the substrate processing.

In the film-forming sequences illustrated in FIGS. 4 and 5, there are performed: a first modification step (first step) of modifying a polysilazane film by heating a wafer 200 having the polysilazane film containing a silazane bond formed over its surface to a first temperature and by supplying a first processing gas containing $H_2O_2$ to the wafer 200; and a second modification step (second step) of modifying the polysilazane film by heating the wafer 200 to a second temperature higher than the first temperature and by supplying a second processing gas containing $H_2O_2$ to the wafer 200, after the first modification step.

In addition, in the film-forming sequences illustrated in FIGS. 4 and 5, there is performed a temperature-rising step (third step) of not performing the supply of the gas containing $H_2O_2$ to the wafer 200 between the first modification step and the second modification step. Furthermore, in the film-forming sequence illustrated in FIG. 4, there is performed a drying step (fourth step) of drying the wafer 200 by supplying a carrier gas not containing $H_2O_2$ to the wafer 200, after the second modification step.

When the term "wafer" is used herein, it may refer to a wafer itself or a laminated body of a wafer and a predetermined layer or film formed over the surface of the wafer. In addition, when the phrase "a surface of a wafer" is used herein, it may refer to a surface of a wafer itself or a surface of a predetermined layer or the like formed over a wafer. Furthermore, in the present disclosure, the expression "a predetermined layer is formed over a wafer" may mean that a predetermined layer is directly formed on a surface of a wafer itself or that a predetermined layer is formed over a layer or the like formed on a wafer. In addition, when the term "substrate" is used herein, it may be synonymous with the term "wafer."

(Substrate-Loading Step)

A plurality of wafers 200 having a polysilazane film formed over each of their surfaces is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 via the O-ring 220.

(Pressure Regulation and Temperature Adjustment Step)

The interior of the process chamber 201, namely the space in which the wafers 200 are located, is vacuum-exhausted by the vacuum pump 246 so as to reach a desired pressure (modifying pressure). In this operation, the internal pressure of the process chamber 201 is measured by the pressure sensor 245. The APC valve 244 is feedback-controlled based on the measured pressure information. Furthermore, the wafers 200 are heated by the heater 207 to a desired temperature (first temperature). In this operation, the state of supplying electric power to the heater 207 is feedback-controlled based on the temperature information detected by the temperature sensor 263 such that the wafers 200 reach the desired temperature. The feedback control of the heater 207 may be continuously performed at least until the processing of the wafers 200 is completed. In addition, the rotation of the wafers 200 by the rotation mechanism 267 begins. The driving of the vacuum pump 246 and the heating and rotation of the wafers 200 may be all continuously performed until the processing of the wafers 200 is completed.

(First Modification Step)

Subsequently, the valve 243a is opened to start the supply of an $H_2O_2$-containing gas (first processing gas) into the process chamber 201 via the MFC 241a, the gas supply pipe 232a, and the gas supply port 203p. The first processing gas supplied into the process chamber 201 flows downward in the process chamber 201 and is discharged to the outside of the process chamber 201 via the exhaust pipe 231. At this time, the first processing gas is supplied to the wafer 200. At this time, the valve 243b may be opened to supply a carrier gas ($O_2$ gas) into the process chamber 201 via the gas supply pipe 232a and the gas supply port 203p while adjusting the flow rate by the MFC 241b. In this case, the first processing gas is diluted with the $O_2$ gas in the gas supply pipe 232a and supplied into the process chamber 201 in that state. By adjusting the $H_2O_2$ concentration (partial pressure of $H_2O_2$ in the process chamber 201) of the first processing gas by the supply of the $O_2$ gas, it is possible to suppress liquefaction of the first processing gas supplied into the process chamber 201, i.e., liquefaction of the $H_2O_2$ component contained in the first processing gas, or to adjust the modification rate of the polysilazane film. The $H_2O_2$ concentration of the first processing gas may be adjusted by changing the flow rate of the carrier gas for vaporization or the flow rate of the liquid precursor supplied to the gas generator 250a.

The processing condition at the first modification step may be exemplified as follows:

$H_2O_2$ concentration of liquid precursor: 20 to 40%, or 25 to 35% in some embodiments Flow rate of liquid precursor: 1.0 to 10 sccm, or 1.6 to 8 sccm in some embodiments Vaporization condition of liquid precursor: heating to 120 to 200 degrees C. under substantially atmospheric pressure Modifying pressure: 700 to 1,000 hPa (any of atmospheric pressure, slight depressurization and slight pressurization)

Temperature of wafer 200 (first temperature): 70 degrees C. or higher and lower than 300 degrees C.

Total flow rate of $O_2$ gas (carrier gas for vaporization and carrier gas (dilution gas)): 0 to 20 SLM, or 5 to 10 SLM in some embodiments.

The $H_2O_2$ concentration of the first processing gas is set to a concentration such that the partial pressure of $H_2O_2$ in the process chamber 201 becomes a pressure of a saturation vapor pressure or lower of $H_2O_2$ in the process chamber 201 in which the wafer 200 heated to the first temperature is accommodated. This prevents the first processing gas containing $H_2O_2$ from being liquefied in the process chamber 201. Furthermore, from the view of improving the oxidization process rate, it is desirable that the partial pressure of $H_2O_2$ be as close as possible to the saturation vapor pressure in some embodiments.

By supplying the first processing gas to the wafer 200 under the aforementioned condition and maintaining this state for a predetermined first time (e.g., a time which falls within a range of 20 to 720 minutes), it is possible to modify (oxidize) the polysilazane film formed over the wafer 200. That is, an O component contained in the first processing gas can be added into the polysilazane film, and an impurity (first impurity) such as an N component, a C component, an H component or the like contained in the polysilazane film can be desorbed from that film.

As described above, $H_2O_2$ contained in the first processing gas has very strong oxidizing power. Therefore, even when the first temperature is set to the aforementioned low temperature condition, it is possible to allow the oxidization process on the polysilazane film to go ahead at a practical rate. Furthermore, by setting the first temperature to the aforementioned low temperature condition, it is possible to suppress curing (condensation) of the surface of the polysilazane film resulting from the first modification step. Therefore, it is possible to efficiently permeate the $H_2O_2$ component or $H_2O$ component contained in the first processing gas not only into the surface of the polysilazane film but also into that film (in the thickness direction) at the first modification step. As a result, it is possible to achieve the effects of the aforementioned modification not only on the surface of that film but also on the deep part of the film.

Furthermore, in order to achieve the modification effects over the entire region of the polysilazane film in the thickness direction, it is desirable that the first modification step be continuously performed over the entire region of the polysilazane film in the thickness direction, i.e., at least until the $H_2O_2$ component or the like reaches the deep part of the film, in some embodiments. It is also desirable that the period (first time) during which the first modification step is performed be increased according to an increase of the film thickness of the polysilazane film in some embodiments. In addition, since the time taken for the modification effects at the first processing step to reach the entire region of the polysilazane film in the thickness direction is generally longer than the time taken for the modification effects at the second modification step as described hereinbelow to be completed, it is desirable that, for example, the period (first time) during which the first modification step is performed be set to a length equal to or longer than the period (second time) during which the second modification step is performed in some embodiments.

Furthermore, if the temperature of the wafer 200 is lower than 70 degrees C., the first processing gas containing $H_2O_2$ is easily liquefied, particularly under the condition of atmospheric pressure (or slight depressurization or slight pressurization) as the present embodiments. Thus, there may be a case where the particles resulting from the liquefaction are generated, uniform oxidization process may not be performed in the plane of the wafers or between the wafers, or the liquefied high-concentration $H_2O_2$-containing liquid remains around the furnace opening of the reaction tube 203. By setting the temperature of the wafer 200 at a predetermined temperature of 70 degrees C. or higher, it is possible to allow the oxidization process to go ahead while suppressing the liquefaction of the first processing gas under the pressure condition as in the present embodiments. In addition, when the liquefaction of the first processing gas is suppressed by changing the pressure condition in the process chamber 201, the flow rate of the carrier gas or the like, the temperature of the wafer 200 may be set lower than 70 degrees C. Moreover, when the temperature of the wafer 200 reaches 300 degrees C. or higher, the surface of the polysilazane film is cured, which may make it difficult to permeate the $H_2O_2$ component or $H_2O$ component into the film. By setting the temperature of the wafer 200 at a predetermined temperature of lower than 300 degrees C., it is possible to suppress curing of the surface of the polysilazane film, and to achieve the modification effects over the entire region of the film in the thickness direction by permeating the $H_2O_2$ component or $H_2O$ component into the film.

(Temperature-Rising Step)

After the lapse of a predetermined time, when the modification process of the polysilazane film under a first temperature condition is completed, the valve 243a is closed to stop the supply of the first processing gas to the wafer 200, and the temperature of the wafer 200 is raised to a second temperature higher than the first temperature. Furthermore, when an $O_2$ gas is supplied from the gas supply pipe 232b at the first modification step, the $O_2$ gas may be continuously supplied with the valve 243b kept opened until the next second modification step starts. Alternatively, the valve 243b may be closed to stop the supply of the $O_2$ gas into the process chamber 201 simultaneously with the stopping of the supply of the first processing gas or after the lapse of a predetermined time.

(Second Modification Step)

When the temperature of the wafer 200 reaches the second temperature higher than the first temperature and is stabilized, the supply of an $H_2O_2$-containing gas (second processing gas) to the wafer 200 starts according to the same processing procedures as those of the first modification step. Also, at this step, an $O_2$ gas may be supplied into the process chamber 201 as the first modification step. By adjusting the $H_2O_2$ concentration (partial pressure of $H_2O_2$ in the process chamber 201) of the second processing gas by the supply of the $O_2$ gas, it is possible to suppress liquefaction of the second processing gas supplied into the process chamber 201, i.e., liquefaction of the $H_2O_2$ component contained in the second processing gas, or to adjust the modification rate of the polysilazane film. The $H_2O_2$ concentration of the second processing gas may be adjusted by changing the flow rate of the carrier gas for vaporization or the flow rate of the liquid precursor supplied to the gas generator 250a. However, at this step, since the internal temperature of the process chamber 201 is set at the second temperature higher than the first temperature, even when the $H_2O_2$ concentration of the second processing gas is set higher than that of the first processing gas, the liquefaction of the second processing gas is less likely to occur.

The processing condition at the second modification step may be exemplified as follows:

$H_2O_2$ concentration of liquid precursor: 20 to 40%, or 25 to 35% in some embodiments Flow rate of liquid precursor: 1.0 to 10 sccm, or 1.6 to 8 sccm in some embodiments Vaporization condition of liquid precursor: heating to 120 to 200 degrees C. under substantially atmospheric pressure Modifying pressure: 700 to 1,000 hPa (any of atmospheric pressure, slight depressurization and slight pressurization)

Temperature of wafer 200 (second temperature): 300 to 500 degrees C.

Total flow rate of $O_2$ gas (carrier gas for vaporization and carrier gas (dilution gas)): 0 to 20 SLM, or 5 to 10 SLM in some embodiments.

Furthermore, in order to reliably obtain the action of the modification process at this step, it is desirable that the second temperature be set at a temperature higher than the first temperature by 100 degrees C. or higher in some embodiments. However, it is desirable that the second temperature be 500 degrees C. or lower in consideration of the influence or the like of thermal history (thermal budget) on the device or the like formed over the wafer 200 in some embodiments.

In addition, it is desirable that the $H_2O_2$ concentration of the second processing gas be set to a concentration higher than the $H_2O_2$ concentration of the first processing gas in some embodiments. The $H_2O_2$ concentration of the second processing gas is set to a concentration such that the partial pressure of $H_2O_2$ in the process chamber 201 becomes a pressure of the saturation vapor pressure or lower of $H_2O_2$ in the process chamber 201 in which the wafer 200 heated to the second temperature is accommodated as the case of the first modification step. However, by setting the second temperature at a temperature higher than the first temperature at the second modification step, it is possible to make the saturation vapor pressure of $H_2O_2$ in the process chamber 201 higher than that of the first modification step. Therefore, even when the $H_2O_2$ concentration of the second processing gas is higher than that of the first processing gas, the modification process can be performed without the second processing gas containing $H_2O_2$ being liquefied in the process chamber 201.

By supplying the second processing gas to the wafer 200 under the aforementioned condition and maintaining this state for a predetermined second time (a time shorter than the first time, for example, a time which falls within a range of 5 to 180 minutes), it is possible to further modify (oxidize) the film modified at the first modification step. Furthermore, the O component can be further added into the film modified at the first modification step, and an impurity (second impurity) such as an N component, a C component, an H component or the like contained in the polysilazane film, which is difficult to be removed by performing the first modification step, can be desorbed from the film.

In the present embodiments, by performing the second modification step under a condition of the second temperature higher than the first temperature, it is possible to make the action of oxidation obtained at this step stronger than that obtained at the first modification step. Furthermore, as described above, by performing the second modification step under the condition of the second temperature higher than the first temperature, it is possible to suppress the liquefaction of the second processing gas. Therefore, in the present embodiments, a gas having a higher concentration of $H_2O_2$ than the first processing gas can be used as the second processing gas, which makes it possible to make the action of oxidation further strong.

Furthermore, in the present embodiments, since the second modification step is performed under the condition of the second temperature higher than the first temperature, $H_2O_2$ or the like permeated into the film when the first modification step is performed can be contributed to the oxidation process under a higher temperature condition. For example, by heating the wafer 200 to the second temperature, it is possible to modify (oxidize) the film by activating $H_2O_2$, $H_2O$ or the like permeated into the film, and to desorb the second impurity, which is difficult to be removed by performing the first modification step, from the film in that process. As a result, it is possible to obtain the aforementioned action of modification over the entire region of the film in the thickness direction (up to the deep part of the film).

Moreover, in the present embodiments, $H_2O_2$, $H_2O$ or the like is efficiently permeated into the film while suppressing curing of the surface of the polysilazane film by performing the first modification step under a condition of the first temperature (particularly, lower than 300 degrees C.) lower than the second temperature, before the second modification step. The component such as $H_2O_2$ or the like permeated at the first modification step has the action of promoting the permeation of the component such as $H_2O_2$ or the like into the film also at the second modification step. Therefore, the component such as $H_2O_2$ or the like is easily permeated into the film also at the second modification step performed under the condition of the second temperature higher than the first temperature (particularly, 300 degrees C. or higher at which the curing of the surface of the polysilazane film easily goes ahead). Thus, it is possible to achieve the modification effects by the component such as $H_2O_2$ or the like over the entire region of the film in the thickness direction (up to the deep part of the film).

As a result of these, it is possible to further add the O component to the film modified at the first modification step over the entire region thereof in the thickness direction. In addition, it is possible to desorb the impurity (second impurity), which cannot be removed by performing the first modification step, from the film, and to change this film to a high quality silicon oxide film (SiO film) having a very low impurity concentration over the entire region of the film in the thickness direction.

(Drying Step)

After the lapse of a predetermined time, when the modification process of the film performed under the second temperature condition is completed, the supply of the second processing gas to the wafer 200 is stopped. Then, the wafer 200 is dried by supplying an $H_2O_2$-free $O_2$ gas to the wafer 200. It is desirable that this step be performed in a state in which the temperature of the wafer 200 is kept at the aforementioned second temperature or set at a temperature higher than the aforementioned second temperature in some embodiments. Thus, it is possible to promote drying of the wafer 200. That is, it is possible to efficiently desorb the $H_2O_2$ component or $H_2O$ component from the surface of the film or from the film modified by performing the second modification step. Furthermore, by executing the drying step while keeping at the second temperature, the temperature rising between the second modification step and the drying step is omitted, thereby shortening the time from the end of the second modification step to the start of the drying step and achieving the modification effects by the component such as $H_2O_2$, $H_2O$ or the like remaining within the film even at the drying step.

(Temperature Dropping and Atmospheric Pressure Return Step)

After the drying step is completed, the interior of the process chamber 201 is vacuum-exhausted. Thereafter, by supplying an $N_2$ gas into the process chamber 201, the interior of the process chamber 201 is returned to an atmospheric pressure, and the heat capacity in the process chamber 201 is increased. Thus, it is possible to uniformly heat the wafers 200 or the members in the process chamber 201, and to remove the particles, impurity, outgassing, or the like, which cannot be removed by vacuum-exhaust, from the interior of the process chamber 201. After the lapse of a predetermined time, the internal temperature of the process chamber 201 is dropped to a predetermined loadable temperature.

(Substrate-Unloading Step)

The seal cap 219 is moved down by the boat elevator 115 to open the lower end of the reaction tube 203. Then, the processed wafers 200 supported on the boat 217 are unloaded from the lower end of the reaction tube 203 to the outside of the reaction tube 203 (boat unloading). The processed wafers 200 are unloaded to the outside of the reaction tube 203 and subsequently discharged from the boat 217 (wafer discharging).

(4) Effects According to the Present Embodiments

According to the present embodiments, one or more effects as set forth below may be achieved.

(a) By using the processing gas containing $H_2O_2$ at the first modification step, even when the processing temperature (first temperature) is set to the aforementioned low temperature condition, it is possible to allow the oxidation process on the polysilazane film to go ahead at a practical rate.

(b) By setting the processing temperature to the aforementioned low temperature condition at the first modification step, it is possible to suppress the curing of the surface of the polysilazane film resulting from performing the first modification step, and to permeate the $H_2O_2$ component or $H_2O$ component into the film. As a result, it is possible to widely spread the modification effects to the deep part of that film.

(c) By setting the processing temperature at the second temperature higher than the first temperature by, e.g., 100 degrees C. or higher, at the second modification step, it is possible to enhance the action of oxidation compared with that of the first modification step.

(d) By setting the treatment temperature at the second temperature higher than the first temperature by, e.g., 100 degrees C. or higher, at the second modification step, it is possible to contribute to the modification (oxidation) process of the film by activating the $H_2O_2$ component or $H_2O$ component permeated into the film, and to extend the aforementioned action of modification over the entire region of the film in the thickness direction.

(e) By using a gas having an $H_2O_2$ concentration higher than that of the first processing gas as the second processing gas at the second modification step, it is possible to further enhance the action of oxidation.

(f) By performing the first modification step and the second modification step in this order, it is possible to change the polysilazane film formed over the wafer 200 to a good quality SiO film having a very low impurity concentration over the entire region of the film in the thickness direction.

Furthermore, when only the first modification step is performed and the second modification step is not performed, or when the first modification step is not performed and only the second modification step is performed, it is difficult to achieve the same effects as those of the present embodiments. In addition, even if the second modification step is performed before the first modification step, it is difficult to achieve the same effects as those of the present embodiments. This is considered to be because, when the second modification step performed under the second temperature condition is first performed, the curing of the surface of the polysilazane film goes ahead from the beginning, and thereafter, the $H_2O_2$ component or $H_2O$ component becomes difficult to be permeated into the film.

(g) The effects mentioned above can be similarly achieved in the case where an O-containing gas other than the $O_2$ gas is used as the carrier gas, or in the case where an inert gas such as an $N_2$ gas, a rare gas or the like is used as the carrier gas.

(5) Modification Examples

The present embodiments may be modified as the modification examples described below. Furthermore, these modification examples may be arbitrarily combined.

Modification Example 1

Figure 6A:
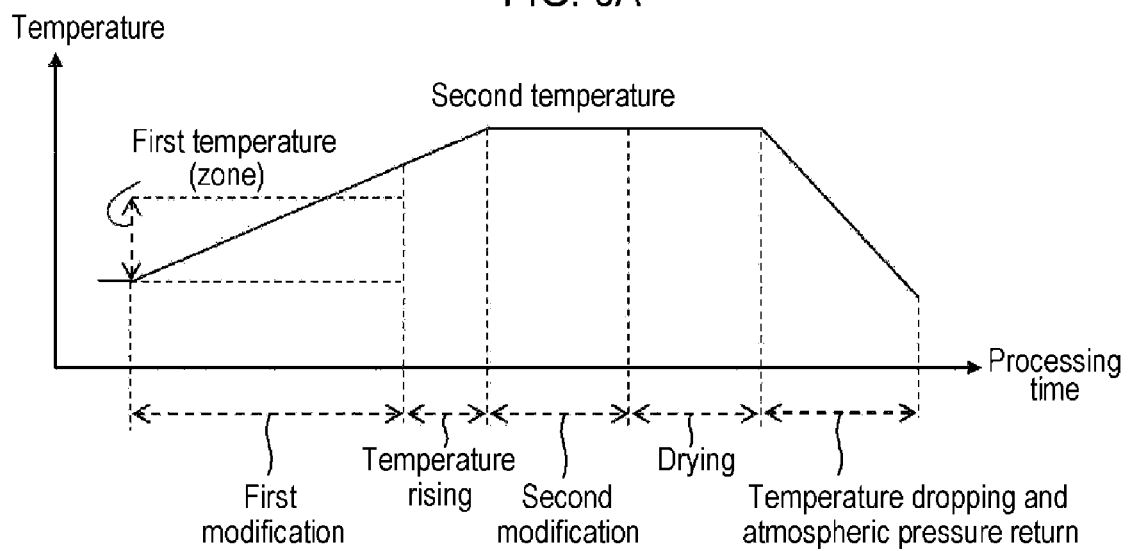
FIGS. 6A to 6C are flowcharts illustrating modification examples of temperature control in the substrate processing.
Figure 6B:
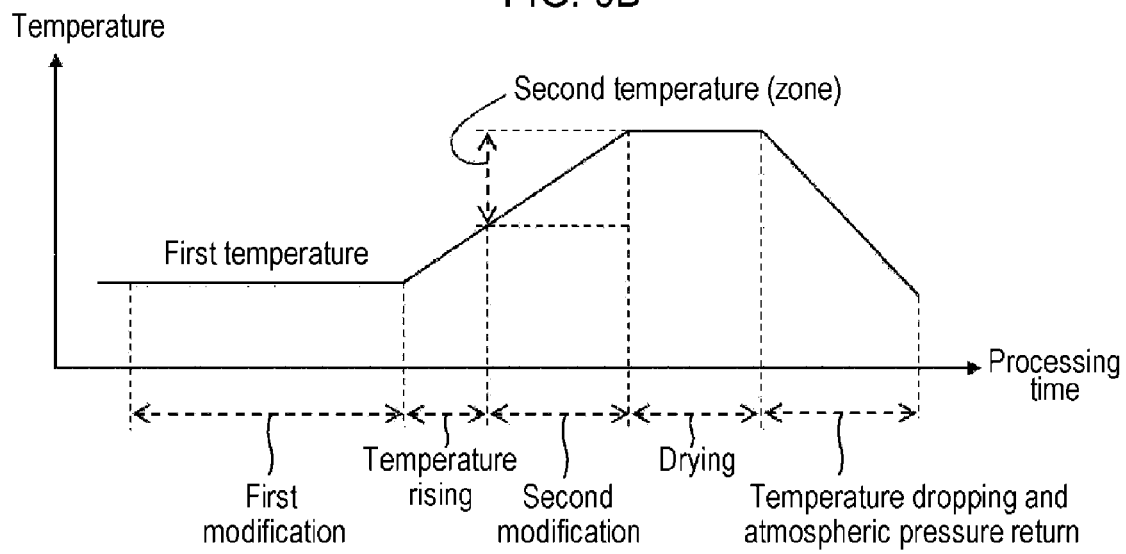
Figure 6C:
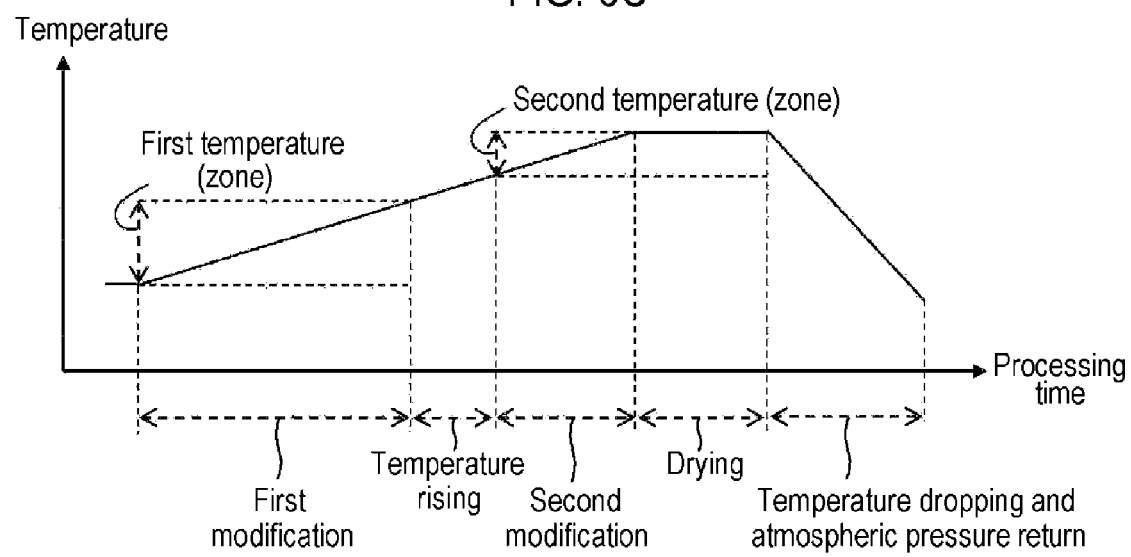

As illustrated in FIG. 6A, at the first modification step, the temperature of the wafer 200 is not limited to a case where the temperature of the wafer 200 is raised to the first temperature and kept constant, but the temperature of the wafer 200 may be varied within the aforementioned range (70 degrees C. or higher and lower than 300 degrees C.). Furthermore, as illustrated in FIG. 6B, at the second modification step, the temperature of the wafer 200 is not limited to a case where the temperature of the wafer 200 is raised to the second temperature and kept constant, but the temperature of the wafer 200 may be varied within the aforementioned range (300 degrees C. to 500 degrees C.). In addition, as illustrated in FIG. 6C, the temperature of the wafer 200 may be varied at each of the first modification step and the second modification step. That is, each of the first temperature and the second temperature may be considered as a temperature zone having a predetermined width. Moreover, in these modification examples, the temperature-rising step may not be performed. In addition, the temperature of the wafer 200 when performing the drying step may be varied. Furthermore, in the case of varying the first temperature and the second temperature, the temperature may be raised as illustrated, and in this case, the temperature-rising rate may be constant or may be varied. Moreover, when the first temperature and the second temperature are varied, the temperature may be dropped, and in this case, the temperature-dropping rate may be constant or may be varied. Furthermore, in the case of varying the first temperature and the second temperature, the temperature rising and the temperature dropping may be alternately performed.

Modification Example 2

In at least one of the first modification step and the second modification step, when the processing gas is supplied into the process chamber 201, the processing gas is filled in the process chamber 201 and the interior of the process chamber 201 may be pressurized by closing the APC valve 244 or reducing its opening degree. Thus, it is possible to uniformize the concentration distribution of the processing gas in the process chamber 201, and to improve the uniformity of the modification process between the wafers 200 and in the plane of the wafers 200. In addition, by pressurizing the interior of the process chamber 201, it is possible to promote the aforementioned oxidation reaction and to improve the quality of the SiO film. Moreover, it is possible to shorten the time required for the oxidation process and to improve the productivity.

Modification Example 3

An $O_2$ gas may be allowed to flow from the gas supply pipe 232b before the supply of the first processing gas into the process chamber 201 starts and to make the interior of the process chamber 201 in an $O_2$ gas atmosphere in advance. Thus, it is possible to improve the productivity of the aforementioned modification process or to improve the quality of the SiO film. In addition, it is possible to improve the uniformity of the modification process between the wafers 200 and in the plane of the wafers 200 or to suppress the generation of foreign matter in the process chamber 201. Even in this case, when the supply of the first processing gas starts without making the interior of the process chamber 201 in an $O_2$ gas atmosphere, the difference in start timing of the modification process may be large at the upper and lower sides of the wafer accommodation region and at the peripheral portion and the central portion of the wafers 200. Furthermore, the impurity contained in the first processing gas and the solvent or impurity remaining within the polysilazane film may excessively react to generate foreign matter. By making the interior of the process chamber 201 in an $O_2$ gas atmosphere in advance, it is possible to solve these problems. Furthermore, the impurity contained in the processing gas is one derived from the stabilizer or impurity contained in the liquid precursor used to generate the first processing gas.

Modification Example 4

At the temperature-rising step, an $H_2O_2$-containing gas may be supplied to the wafer 200 while raising the temperature of the wafer 200 from the first temperature to the second temperature. The $H_2O_2$-containing gas supplied here may be one for continuously supplying the first processing gas at the first modification step, or may be one switched to the second processing gas at the second modification step. Moreover, the $H_2O_2$-containing gas may be one switched to the second processing gas from the first processing gas during the temperature-rising step. In addition, the $H_2O_2$-containing gas may be one obtained by gradually (or stepwise) changing the $H_2O_2$ concentration of the first processing gas to become equal to the concentration in the second processing gas. However, in the case of changing the concentration of the $H_2O_2$-containing gas generated in the gas generator 250a, a predetermined time is required until the gas concentration is stabilized. Therefore, when switching the first processing gas to the second processing gas having a different concentration, it is desirable that the supply of the $H_2O_2$-containing gas into the process chamber 201 not be performed until the gas concentration is stabilized, and the supply of the second processing gas into the process chamber 201 starts after the gas concentration is stabilized in some embodiments.

Other Embodiments of the Present Disclosure

While one or more embodiments of the present disclosure have been specifically described above, the present disclosure is not limited to the aforementioned embodiments but may be variously modified without departing from the spirit of the present disclosure.

For example, in the aforementioned embodiments, there has been described an example in which a processing gas is generated outside the process chamber 201, but the processing gas may be generated inside the process chamber 201. For example, a liquid precursor may be supplied to the top plate 217a heated by a lamp heater or the like, and the processing gas may be generated by vaporizing the liquid precursor.

In the aforementioned embodiments, there has been described an example in which a substrate over which a polysilazane film is formed is processed, but the present disclosure is not limited thereto. That is, even if a film to be processed is not a polysilazane film, the same effects as those of the aforementioned embodiments may be achieved.

Figure 3B:
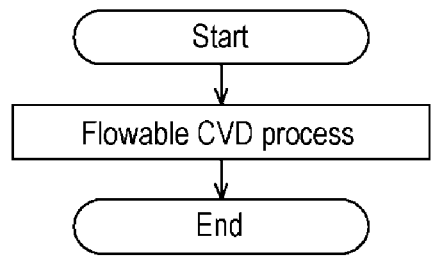

In the aforementioned embodiments, there has been described an example in which a polysilazane film formed by performing a PHPS-coating process and a pre-baking process is processed, the present disclosure is not limited thereto. For example, as illustrated in FIG. 3B, even in the case of processing a polysilazane film which is formed by a flowable CVD method and is not pre-baked, the same effects as those of the aforementioned embodiments may be achieved.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there have been described examples in which films are formed using the substrate processing apparatus provided with a hot-wall-type process furnace. The present disclosure is not limited to the aforementioned embodiments but may be appropriately applied to a case where films are formed using a substrate processing apparatus provided with a cold-wall-type process furnace.

The embodiments, modification examples and the like described above may be appropriately combined with one another. The processing procedures and processing conditions at this time may be similar to, for example, the processing procedures and processing conditions of the aforementioned embodiments.

Embodiment Examples

Next, embodiment examples of the present disclosure will be described.

In sample 1, a polysilazane film formed over the wafer was modified using the substrate processing apparatus illustrated in FIG. 1. When producing the film of sample 1, only the first modification step in the aforementioned embodiments was performed, and the second modification step was not performed. The processing time of the first modification step was set equal to a total execution time of the first modification step and the second modification step in the aforementioned embodiments, and the time for performing the modification process using the $H_2O_2$-containing gas was set equal. An $O_2$ gas was used as the carrier gas, and the processing conditions at each step other than the second modification step were set to predetermined conditions which fall within the processing condition range described in the aforementioned embodiments.

In sample 2, a polysilazane film formed over the wafer was modified using the substrate processing apparatus illustrated in FIG. 1. When producing the film of sample 2, only the second modification step in the aforementioned embodiments was performed, and the first modification step was not performed. The processing time of the second modification step was set equal to the total execution time of the first modification step and the second modification step in the aforementioned embodiments, and the time for performing the modification process using the $H_2O_2$-containing gas was set equal. An $O_2$ gas was used as the carrier gas, and the processing conditions at each step other than the first modification step were set to predetermined conditions which fall within the processing condition range described in the aforementioned embodiments.

In sample 3, a polysilazane film formed over the wafer was modified according to the same processing procedures as those of the aforementioned embodiments, i.e., by performing the first modification step and the second modification step in this order, using the substrate processing apparatus illustrated in FIG. 1. An $O_2$ gas was used as the carrier gas, and the processing conditions at each step were set to predetermined conditions which fall within the processing condition range described in the aforementioned embodiments.

Figure 7:
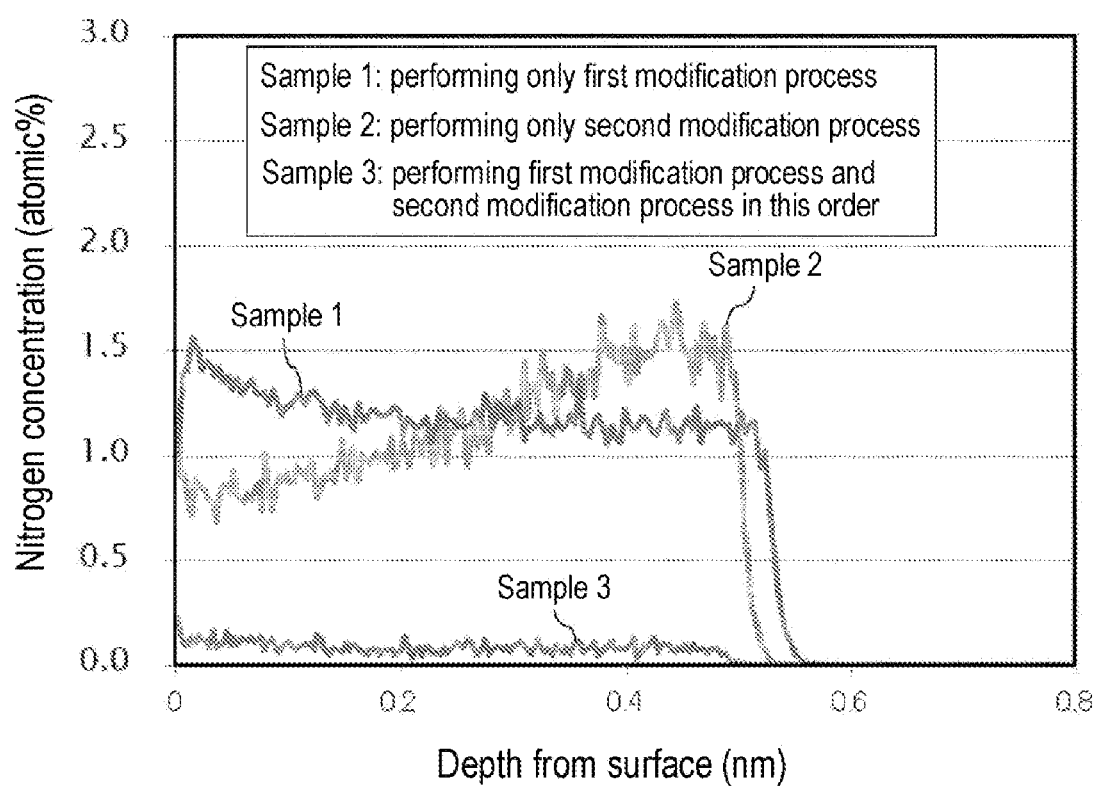
FIG. 7 is a diagram illustrating a measurement result of nitrogen concentration contained in a film after a modification process.

Then, the compositions of the films of samples 1 to 3 were measured. The evaluation results are shown in FIG. 7. In FIG. 7, the vertical axis indicates an N concentration (atomic %) in the film, and the horizontal axis indicates a depth (nm) from the surface of the film. According to FIG. 7, it can be seen that in the film of sample 3, the N concentration in the film is significantly reduced over the entire region of the film in the thickness direction compared with the films of samples 1 and 2. That is, it can be seen that, by performing the first modification step and the second modification step in this order, the polysilazane film formed over the wafer can be changed to a good quality SiO film having a very low impurity concentration over the entire region of the film in the thickness direction. Furthermore, when only the first modification step is performed and the second modification step is not performed as sample 1, or when the first modification step is not performed and only the second modification step is performed as sample 2, it is to be understood that the same effects as those of sample 3 cannot be achieved.

According to the present disclosure in some embodiments, it is possible to improve a quality of substrate processing performed using hydrogen peroxide.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
 a first act of modifying a film containing a silazane bond by heating a substrate, in which the film containing the silazane bond is formed over a surface of the substrate, to a first temperature and by supplying a first processing gas containing hydrogen peroxide to the substrate;
 after the first act, a second act of modifying the film containing the silazane bond by heating the substrate to a second temperature higher than the first temperature and by supplying a second processing gas containing hydrogen peroxide to the substrate; and
 between the first act and the second act, a third act of not performing a supply of a gas containing hydrogen peroxide to the substrate,
 wherein in the third act, an oxygen-containing gas not containing hydrogen peroxide is supplied to the substrate.

2. The method according to claim 1, wherein the film containing the silazane bond is made of polysilazane.

3. The method according to claim 1, wherein in the first act, a state in which the substrate is heated to the first temperature is maintained for a predetermined time.

4. The method according to claim 1, wherein in the second act, a state in which the substrate is heated to the second temperature is maintained for a predetermined time.

5. The method according to claim 1, wherein a period during which the first act is performed is set equal to or longer than a period during which the second act is performed.

6. The method according to claim 1, wherein the first act is performed at least until the hydrogen peroxide is permeated into the film over an entire region of the film containing the silazane bond in a thickness direction.

7. The method according to claim 1, wherein a concentration of the hydrogen peroxide of the second processing gas is higher than a concentration of the hydrogen peroxide of the first processing gas.

8. The method according to claim 1, wherein the first temperature is set at a predetermined temperature which falls within a range that is higher than or equal to 70 degrees C. and lower than 300 degrees C.

9. The method according to claim 1, wherein the second temperature is set at a predetermined temperature which falls within a range that is higher than or equal to 300 degrees C. and lower than or equal to 500 degrees C.

10. The method according to claim 1, wherein the second temperature is set at a predetermined temperature higher than the first temperature by 100 degrees C. or greater.

11. The method according to claim 1, further comprising, after the second act, a fourth act of drying the substrate by supplying an oxygen-containing gas not containing hydrogen peroxide to the substrate.

12. The method according to claim 11, wherein the fourth act is performed in a state in which a temperature of the substrate is maintained at the second temperature.

13. A non-transitory computer-readable recording medium storing a program that causes, by a computer, a substrate processing apparatus to perform a process in a process chamber of the substrate processing apparatus, the process comprising:

- a first act of modifying a film containing a silazane bond by heating a substrate, in which the film containing the silazane bond is formed over a surface of the substrate, to a first temperature and by supplying a first processing gas containing hydrogen peroxide to the substrate;
- after the first act, a second act of modifying the film containing the silazane bond by heating the substrate to a second temperature higher than the first temperature and by supplying a second processing gas containing hydrogen peroxide to the substrate; and
- between the first act and the second act, a third act of not performing a supply of a gas containing hydrogen peroxide to the substrate,
- wherein in the third act, an oxygen-containing gas not containing hydrogen peroxide is supplied to the substrate.

* * * * *